United States Patent
Akaike et al.

(10) Patent No.: US 9,100,023 B2
(45) Date of Patent: Aug. 4, 2015

(54) PIECE-CRYSTAL OSCILLATOR AND OSCILLATION DEVICE

(71) Applicant: NIHON DEMPA KOGYO CO., LTD., Tokyo (JP)

(72) Inventors: Kazuo Akaike, Saitama (JP); Kaoru Kobayashi, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/226,826

(22) Filed: Mar. 27, 2014

(65) Prior Publication Data

US 2014/0292424 A1    Oct. 2, 2014

(30) Foreign Application Priority Data

Mar. 29, 2013    (JP) .................................. 2013-074854

(51) Int. Cl.
H03L 1/02    (2006.01)
(52) U.S. Cl.
CPC ...................................... *H03L 1/028* (2013.01)
(58) Field of Classification Search
CPC ........................................................ H03L 1/022
USPC .................................................. 331/176, 70
See application file for complete search history.

(56) References Cited

U.S. PATENT DOCUMENTS

2014/0292424 A1*    10/2014    Akaike et al. ................... 331/70

FOREIGN PATENT DOCUMENTS

| JP | 2012-170050 | 9/2012 |
| JP | 2012-195932 | 10/2012 |
| JP | 2013-038598 | 2/2013 |
| JP | 2013-051676 | 3/2013 |
| JP | 2013-098865 | 5/2013 |

* cited by examiner

Primary Examiner — Joseph Chang
(74) Attorney, Agent, or Firm — Jianq Chyun IP Office

(57) ABSTRACT

A crystal oscillator includes: an oscillation circuit; first and second oscillation circuits connected to first and second temperature detection crystal units, respectively; a heating portion configured to constantly maintain an ambient temperature; a frequency difference detection portion that obtains, as a temperature detection value, "$\{(f2-f1)/f1\} - \{(f2r-f1r)/f1r\}$", where "f1" and "f2" denote oscillation frequencies of the first and second oscillation circuits, respectively, and "f1r" and "f2r" denote oscillation frequencies of the first and second oscillation circuits, respectively, at a reference temperature; an accumulator that accumulates the temperature detection value; a rounding processing portion that performs rounding for the temperature detection value accumulated in the accumulator depending on a rounding factor designated independently from the accumulation number; and a heating control portion that controls power supplied to the heating portion based on the temperature detection value subjected to the rounding in the rounding processing portion.

8 Claims, 13 Drawing Sheets

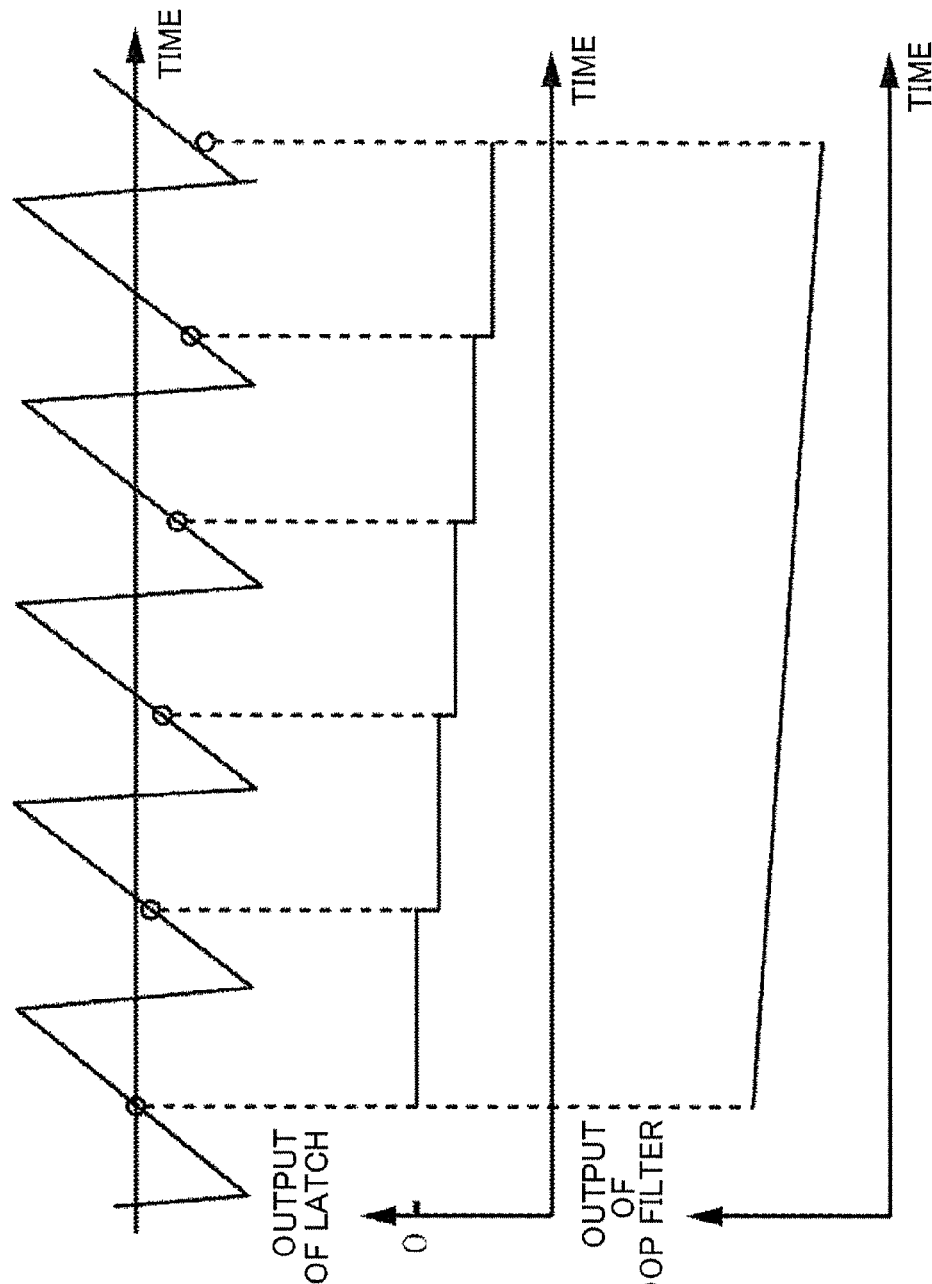

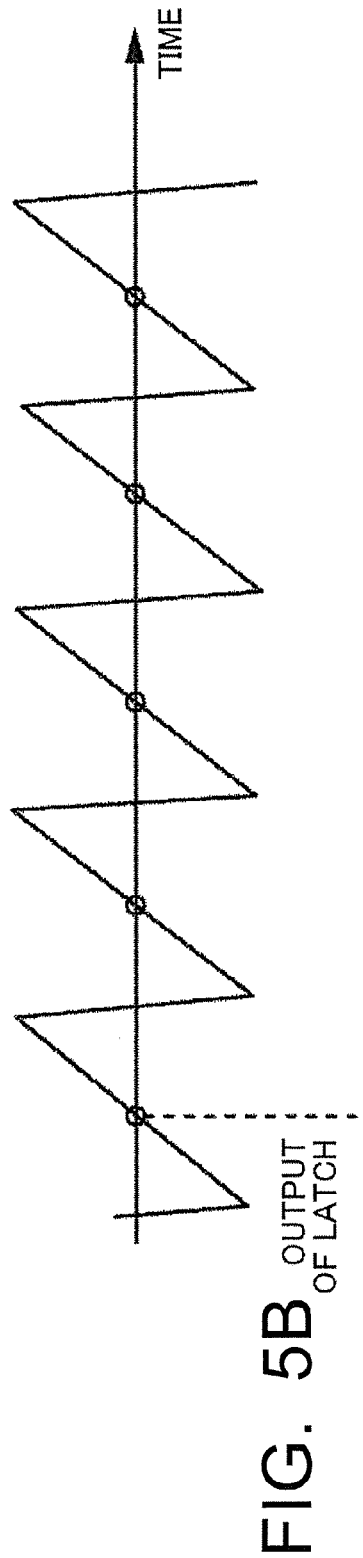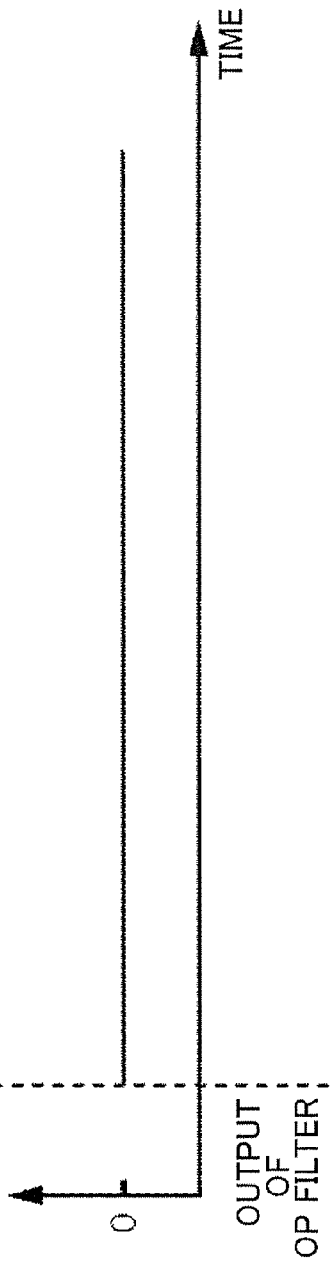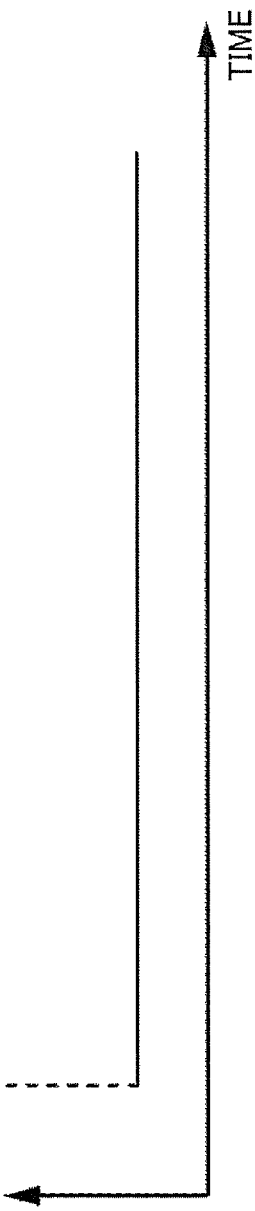
FIG. 5A DDS OUTPUT, LATCH POINT
FIG. 5B OUTPUT OF LATCH
FIG. 5C OUTPUT OF LOOP FILTER

PIECE-CRYSTAL OSCILLATOR AND OSCILLATION DEVICE

CROSS-REFERENCE TO RELATED APPLICATION

This application claims the priority benefit of Japan application serial no. 2013-074854, filed on Mar. 29, 2013. The entirety of the above-mentioned patent application is hereby incorporated by reference herein and made a part of this specification.

TECHNICAL FIELD

This disclosure relates to a crystal oscillator that detects an ambient temperature of a crystal unit and controls a heating portion based on a result of the temperature detection to constantly maintain the ambient temperature, and an oscillating device using the crystal oscillator.

DESCRIPTION OF THE RELATED ART

Typically, an oven-controlled crystal oscillator (OCXO) is employed when a crystal oscillator is incorporated in an application in which significantly high frequency stability is required. In a temperature control of the OCXO, a thermistor is used as a temperature detector, and a discrete component such as an operational amplifier, a resistor, and a capacitor is included. However, due to a variation or aging of an individual analog component, it is difficult to perform a temperature control within a range of ±20 m° C.

However, in a base station, a relay station, and the like, it is demanded to use a clock signal having significantly high stability at a low cost. For this reason, it is difficult to use the OCXO of the related art in such an application.

In Japanese Unexamined Patent Application Publication No. 2012-170050, there is discussed a temperature-compensated crystal oscillator (TCXO) that recognizes a value corresponding to a difference between oscillation frequencies of a pair of crystal units as a temperature detection value and corrects a setting frequency of the oscillation device based on the temperature detection value. More specifically, a pulse train is generated at a timing obtained by latching a pulse as an oscillation output from one of the crystal units with a pulse as an oscillation output from the other crystal unit, and the temperature detection value is generated as a digital value by inputting this pulse train into a phase-locked loop (PLL).

The applicant investigates a design of the OCXO that performs a heater control using the temperature detection value as disclosed in Japanese Unexamined Patent Application Publication No. 2012-170050. A crystal unit that performs temperature detection preferably has an oscillation frequency that significantly changes against a temperature change. For this reason, the applicant investigates a method of using B-mode oscillation using an SC-cut crystal piece without limiting to an AT-cut crystal piece or using a Y-cut crystal piece.

However, a ratio of the oscillation frequency change to the temperature change is different between crystal pieces because the cut orientation of the crystal piece is different. For example, when the B-mode oscillation is employed using the SC-cut crystal piece, the aforementioned ratio is, approximately, 30 ppm/° C. When a Y-cut crystal piece is used, the aforementioned ratio is, approximately, 90 ppm/° C. In addition, even when crystal pieces have the same cut orientation, the aforementioned ratio is different between the crystal pieces due to a variation between batches in some times. For this reason, a circuit size increases if a heater control circuit provided in rear of a temperature detection circuit is shared between crystal pieces. In addition, when sensitivity of the oscillation frequency to the temperature of the crystal piece is high, the temperature detection value significantly changes in a moment. Therefore, if a time constant of the heater control circuit increases, a temperature control operation may be performed inappropriately. From another viewpoint, this means that freedom of selection for a usable crystal piece is degraded.

Thus, a need exists for a crystal oscillator (OCXO) that generates a temperature detection value based on a signal corresponding to a difference between oscillation frequencies of the first and second crystal units, in which the temperature control circuit has an appropriate size, and a heater control can be appropriately performed.

SUMMARY

According to an aspect of this disclosure, there is provided a crystal oscillator including: an oscillation circuit connected to a crystal unit for generating an oscillator output; first and second oscillation circuits connected to first and second temperature detection crystal units, respectively; a heating portion for constantly maintaining an ambient temperature of each of the crystal units; a frequency difference detection portion that obtains, as a temperature detection value, a digital value corresponding to a difference value between a value corresponding to a difference between frequencies f1 and f1$r$ and a value corresponding to a difference between frequencies f2 and f2$r$, where "f1" denotes an oscillation frequency of the first oscillation circuit, "f1$r$" denotes an oscillation frequency of the first oscillation circuit at a reference temperature, "f2" denotes an oscillation frequency of the second oscillation circuit, and "f2$r$" denotes an oscillation frequency of the second oscillation circuit at the reference temperature; an accumulator that accumulates the temperature detection value as the digital value obtained from the frequency difference detection portion depending on a designated accumulation number; a rounding processing portion that performs rounding for the temperature detection value accumulated in the accumulator depending on a rounding factor designated independently from designation of the accumulation number; and a heating control portion that controls power supplied to a heating portion based on the temperature detection value subjected to the rounding in the rounding processing portion.

According to another aspect of this disclosure, there is provided an oscillation device including: the crystal oscillator; and a main body circuit portion of the oscillation device including a phase-locked loop (PLL), in which an oscillation output of the crystal oscillator is used as a clock signal.

An embodiment disclosed here relates to a crystal oscillator (OCXO) that detects an ambient temperature of the crystal unit and controls the heating portion based on a result of the temperature detection to constantly maintain the ambient temperature, in which a value corresponding to a difference between oscillation frequencies of a pair of crystal units is treated as a temperature detection value. In addition, the crystal oscillator according to the embodiment disclosed here is configured such that the rounding factor and the accumulation number of the temperature detection value can be independently designated when the control of the heating portion is performed based on a value obtained by accumulating and averaging (rounding) the temperature detection value. For this reason, it is possible to reduce a variation of the temperature detection sensitivity by selecting the rounding factor even when a ratio (temperature detection sensitivity) of the oscillation frequency change to the temperature change is different between crystal pieces due to a difference of the cut orientation of the crystal piece or a variation between batches of crystal pieces. As a result, it is possible to appropriately set a size of the circuit for performing the temperature control. In addition, it is possible to appropriately perform a heater control and prevent an erroneous operation in the heater control. From another viewpoint, this means that freedom of selection of the employable crystal piece is improved.

BRIEF DESCRIPTION OF THE DRAWINGS

The foregoing and additional features and characteristics of this disclosure will become more apparent from the following detailed description considered with the reference to the accompanying drawings.

FIGS. 4A to 4C are schematic waveform diagrams illustrating waveforms of each part when a loop including the DDS circuit portion of FIG. 2 is not locked.

FIGS. 5A to 5C are schematic waveform diagrams illustrating waveforms of each part when the loop including the DDS circuit portion of FIG. 2 is locked.

DETAILED DESCRIPTION

Outline of Embodiment

Figure 1:
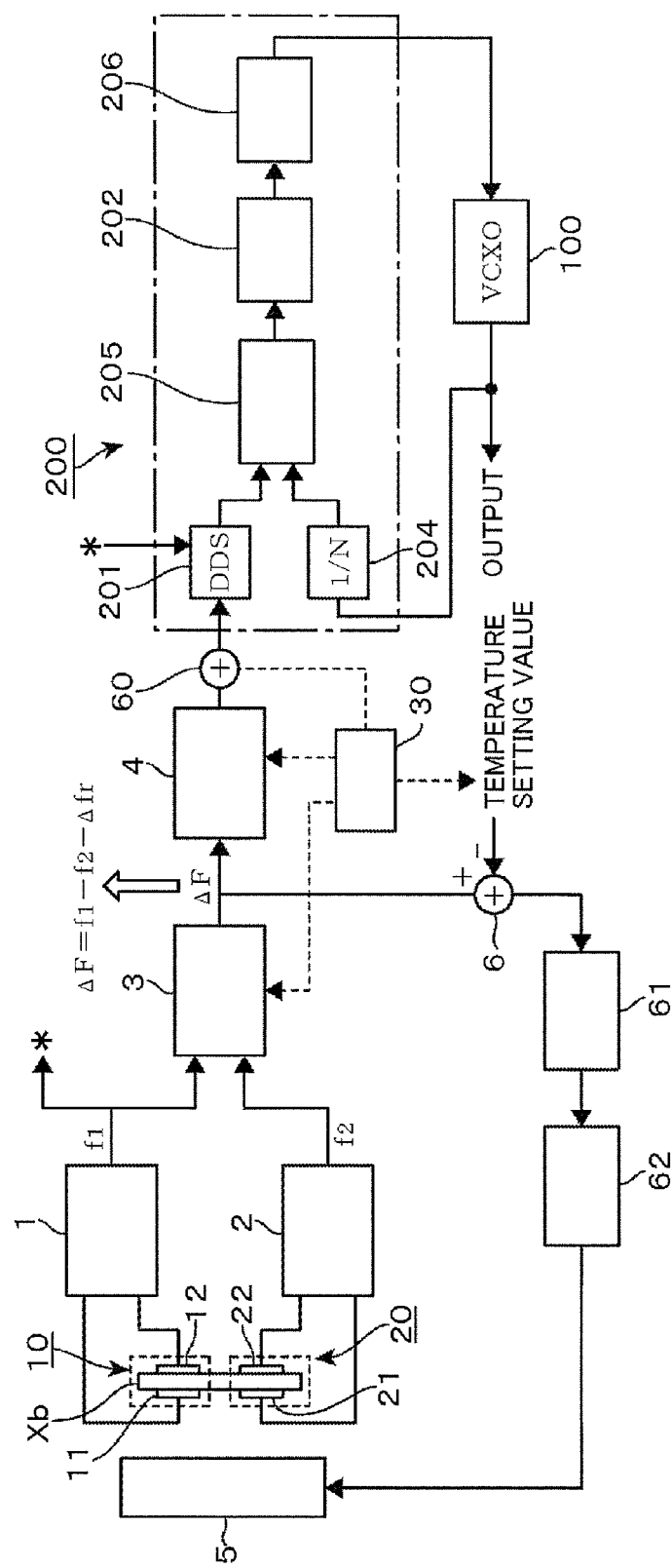
FIG. 1 is a block diagram illustrating the entire configuration according to an embodiment disclosed here.

Before a detailed description of an embodiment of this disclosure, an outline of this embodiment will be described in brief. In FIG. 1, reference numeral "200" denotes a control circuit portion in this specification. However, in practice, it generally denotes a circuit having an oscillation functionality using a phase-locked loop (PLL). Reference numeral "201" denotes a direct digital synthesizer (DDS) that outputs a reference signal used in the PLL.

As a clock signal for operating this DDS, an oscillation output of a first oscillation circuit denoted by reference numeral "1" in FIG. 1 is used. As a result, in order to stabilize an output from a voltage-controlled oscillator 100 (in this example, this output corresponds to an oscillation output as a resulting value), it is necessary to stabilize the clock signal.

In this regard, in order to stabilize the oscillation output from the first oscillation circuit 1, an ambient temperature of a crystal unit 10 is constantly maintained using a heater circuit 5. As a temperature detection signal for controlling a heat amount of the heater circuit 5, a relationship between a temperature and a value corresponding to a difference between the oscillation frequencies of the crystal units 10 and 20 is recognized in advance, and this value corresponding to the difference is used.

The value corresponding to the difference between the oscillation frequencies will be described below in detail. However, in order to avoid complication of terminologies, a portion used to obtain this value will be referred to as a "frequency difference detection portion" 3. It is noted that, in this embodiment, an output ΔF of the frequency difference detection portion 3 corresponding to the temperature detection signal is used in correction of a frequency setting value corresponding to a setting value of the output frequency of the voltage-controlled oscillator 100, as well as in a control of the heater circuit 5. The frequency setting value described above is obtained by causing a computer to read and output data stored in a memory 30. Therefore, the oscillation device according to an embodiment disclosed here has both the oven-controlled crystal oscillator (OCXO) functionality and the temperature-controlled crystal oscillator (TCXO) functionality. It is noted that an embodiment disclosed here may also apply to a case where the TCXO functionality is not provided.

According to an embodiment disclosed here, the frequency difference detection portion 3 is configured to generate the aforementioned output ΔF corresponding to the temperature detection value using the PLL as described below. Then, a cumulative averaging processing is applied to the generated temperature detection value, and a rounding factor and the accumulation number of data are independently controlled when this cumulative averaging processing is performed.

Detailed Description of Embodiment

Next, the entirety of an embodiment of this disclosure will be described in detail. FIG. 1 is a block diagram illustrating the entire oscillation device obtained by applying the crystal oscillator according to an embodiment disclosed here. This oscillation device is configured as a frequency synthesizer that outputs a frequency signal having a predetermined frequency and includes: a voltage-controlled oscillator 100 having a crystal unit; a control circuit portion 200 serving as the PLL in the voltage-controlled oscillator 100; a crystal oscillator (denoted by no reference numeral) that generates a clock signal for operating the DDS 201 for generating a reference signal of the PLL; and a heater 5 serving as a heating portion for controlling an ambient temperature of the crystal units 10 and 20 of the crystal oscillator.

This oscillation device also has a temperature compensation portion that performs temperature compensation for the reference clock input to the control circuit portion 200. Although no reference numeral is given for the temperature compensation portion, the temperature compensation portion corresponds to the left half of the control circuit portion 200 in FIG. 1 and is shared by a circuit portion for controlling the heater 5.

In the control circuit portion 200, the phase comparison portion 205 compares a phase of the reference clock output from the DDS circuit portion 201 and a phase of the clock obtained by dividing the output of the voltage-controlled oscillator 100 using a divider 204, and a charge pump 202 changes a phase difference as a result of the comparison into an analog signal. The analog signal is input to the loop filter 206 and is controlled to stabilize the PLL. Therefore, the control circuit portion 200 may be referred to as a PLL portion. Here, the DDS circuit portion 201 receives frequency data (digital value) for outputting a desired frequency signal by using the frequency signal output from the first oscillation circuit 1 described below as a reference clock.

However, since the frequency of the reference clock has a temperature characteristic, a signal corresponding to a frequency correction value described below is added to the frequency data input to the DDS circuit portion 201 using an adder 60 in order to cancel this temperature characteristic. A temperature change equivalent of the output frequency of the DDS circuit portion 201 caused by a temperature characteristic change of the reference clock is cancelled by correcting the frequency data input to the DDS circuit portion 201. As a result, the frequency of the reference clock is stabilized against a temperature change. This stabilizes the output frequency from the voltage-controlled oscillator 100.

In this embodiment, as described below, since the crystal oscillator for generating the reference clock serves as an OCXO, the frequency of the reference clock is stabilized. Therefore, it can be said that a temperature characteristic of the reference clock is not exhibited. In addition, when a heater suffers from a failure or the like, the temperature change equivalent of the output frequency of the DDS circuit portion 201 caused by the temperature characteristic change of the reference clock is compensated. Therefore, it is possible to configure a frequency synthesizer with significantly high reliability.

Next, the OCXO part corresponding to the crystal oscillator according to an embodiment disclosed here will be described. This crystal oscillator includes first and second crystal units 10 and 20. The first and second crystal units 10 and 20 are configured using a common crystal piece Xb. That is, for example, an area of a rectangular crystal piece Xb is bisectioned along a length direction, and excitation electrodes are provided on both front and rear surfaces of each bisectioned area (oscillation area). Therefore, one of the bisectioned areas and a pair of electrodes 11 and 12 constitute the first crystal unit 10, and the other bisectioned area and a pair of electrodes 21 and 22 constitute the second crystal unit 20. For this reason, it can be said that the first and second crystal units 10 and 20 are thermally combined. In this example, an AT-cut crystal piece Xb is used.

The first and second crystal units 10 and 20 are connected to the first and second oscillation circuits 1 and 2, respectively. Any one of the outputs of the oscillation circuits 1 and 2 may be, for example, either overtones (harmonics) or fundamental waves of the crystal units 10 and 20. When an overtone output is obtained, for example, an overtone tuning circuit may be provided in an oscillation loop including a crystal unit and an amplifier to cause the oscillation loop to oscillate at an overtone. Alternatively, the oscillation loop may be oscillated at a fundamental wave, and a class-C amplifier may be provided in rear of the oscillation stage such an amplifier as a part of a Colpitts circuit, so that the fundamental wave is distorted using the class-C amplifier. In addition, a tuning circuit tuned to an overtone may be provided in rear of the class-C amplifier, so that, for example, a third-order overtone oscillation frequency is output from any one of the oscillation circuit 1 and 2 as a result.

Here, for convenient description purposes, assuming that a frequency signal having a frequency f1 is output from the first oscillation circuit 1, and a frequency signal having a frequency f2 is output from the second oscillation circuit 2, the frequency signal having a frequency f1 is supplied to the control circuit portion 200 as a reference clock. Reference numeral "3" denotes a frequency difference detection portion. Roughly speaking, the frequency difference detection portion 3 is a circuit portion for obtaining a difference "f2−f1−Δfr" which is a difference between a difference between the frequencies f1 and f2 and "Δfr." Here, "Δfr" denotes a difference between "f1(f1$r$)" and "f2(f2$r$)" at a reference temperature of, for example, 25° C. The difference between frequencies f1 and f2 may be, for example, several megahertz (MHz). An embodiment disclosed here is characterized in that the frequency difference detection portion 3 computes the difference ΔF between a value corresponding to a difference between the frequencies f1 and f2 and a value corresponding to the difference between the frequencies f1 and f2 at a reference temperature of, for example, 25° C. In this embodiment, more specifically, the value obtained from the frequency difference detection portion 3 is expressed as {(f2−f1)/f1}−{(f2$r$−f1$r$)/f1$r$}. Note that an indication of the output of the frequency difference detection portion 3 is abbreviated in the drawings.

Figure 2:
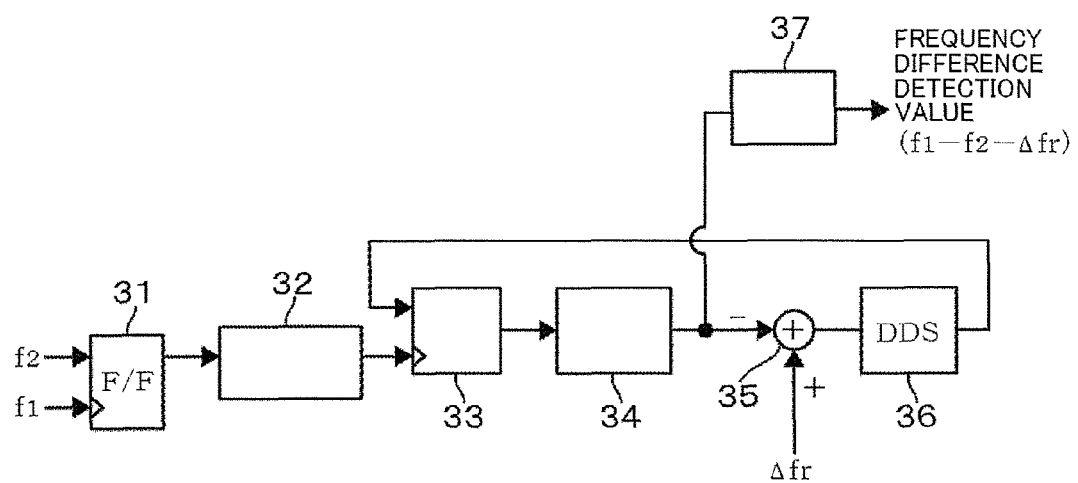
FIG. 2 is a block diagram illustrating a frequency difference detection portion according to an embodiment disclosed here.

FIG. 2 illustrates a specific example of the frequency difference detection portion 3. Reference numeral "31" denotes a flip-flop circuit (F/F circuit). The frequency signal having a frequency f1 from the first oscillation circuit 1 is input to one of the input terminals of the flip-flop circuit 31, and the frequency signal having a frequency f2 from the second oscillation circuit 2 is input to the other input terminal, so that the frequency signal having a frequency f2 from the second oscillation circuit 2 is latched by the frequency signal having a frequency f1 from the first oscillation circuit 1. In the following description, in order to avoid redundant description, it is assumed that "f1" and "f2" denote frequencies or frequency signals. The flip-flop circuit 31 outputs a signal having a frequency (f2−f1) corresponding to a frequency difference between the frequencies f1 and f2.

Figure 3:
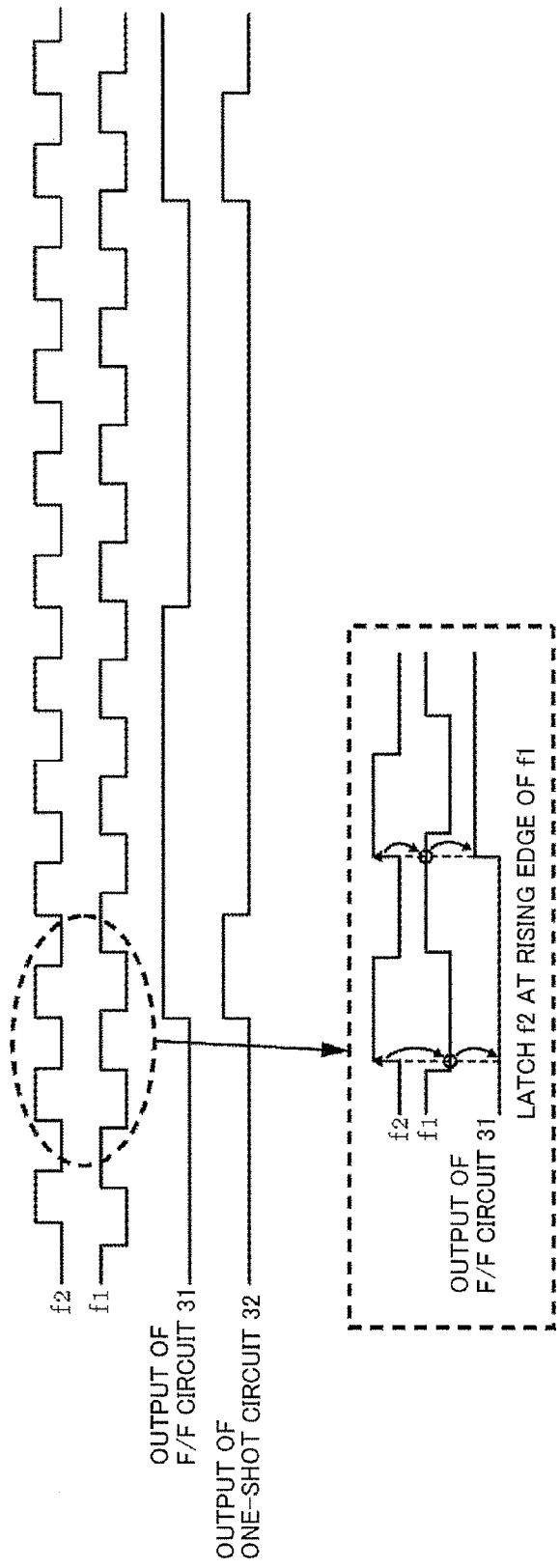
FIG. 3 is a waveform diagram illustrating an output from a part of the circuit of FIG. 2.

A one-shot circuit 32 is provided in rear of the flip-flop circuit 31. The one-shot circuit 32 outputs a one-shot pulse in synchronization with a rising edge of the pulse signal obtained from the flip-flop circuit 31. FIG. 3 is a timing chart illustrating a series of the signals described hereinbefore.

A phase-locked loop (PLL) is provided in rear of the one-shot circuit 32. This PLL includes a latch circuit 33, a first loop filter 34 having an integration functionality, an adder 35, and a DDS circuit portion 36.

The latch circuit 33 is configured to latch a sawtooth wave output from the DDS circuit portion 36 with the pulse output from the one-shot circuit 32. The output of the latch circuit 33 has the same signal level as that of the sawtooth wave at the timing of outputting the pulse. The loop filter 34 integrates a direct current (DC) voltage of this signal level, and the first adder 35 adds this DC voltage and a DC voltage corresponding to "Δfr" (difference between frequencies f1 and f2 at a reference temperature of, for example, 25° C.). Data on the DC voltage corresponding to "Δfr" is stored in a memory 30 of FIG. 1.

In this example, in the first adder 35, an input side of the DC voltage corresponding to "Δfr" has a positive sign "+," and an input side of the output voltage of the first loop filter 34 has a negative sign "−." The DDS circuit portion 36 receives a DC voltage computed by the first adder 35, that is, a voltage obtained by subtracting the output voltage of the loop filter 34 from the DC voltage corresponding to "Δfr" and outputs a sawtooth wave having a frequency corresponding to this voltage value. For easy understanding of the operation of the PLL, FIGS. 4A to 4C schematically illustrate states of the outputs of each part. In addition, for intuitive understanding, description will be made significantly schematically. At the start of the operation, a DC voltage corresponding to "Δfr" is input to the DDS circuit portion 36 via the first adder 35. For example, if the value Δfr is 5 MHz, a sawtooth wave corresponding to this frequency is output from the DDS circuit portion 36.

The latch circuit 33 latches the sawtooth wave with a pulse having a frequency corresponding to the difference (f2−f1). Assuming that the difference (f2−f1) is, for example, 6 MHz, a cycle of the pulse used in the latching is shorter than that of the sawtooth wave. Therefore, the latch point of the sawtooth wave is gradually lowered as illustrated in FIG. 4A, and the output of the latch circuit 33 and the output of the first loop filter 34 are gradually lowered to the negative (−) side as illustrated in FIGS. 4B and 4C. Since the output side of the loop filter 34 of the first adder 35 has a negative sign "−," the DC voltage input from the first adder 35 to the DDS circuit portion 36 increases. For this reason, the frequency of the sawtooth wave output from the DDS circuit portion 36 increases. When a DC voltage corresponding to "6 MHz" is input to the DDS circuit portion 36, the frequency of the sawtooth wave becomes 6 MHz, and the PLL is locked as illustrated in FIGS. 5A to 5C. In this case, the DC voltage output from the loop filter 34 becomes a value corresponding to "Δfr−(f2−f1)=−1 MHz." That is, it can be said that an integration value of the loop filter 34 is an integration value corresponding to a change of "1 MHz" assuming that the sawtooth wave changes from 5 MHz to 6 MHz.

Figure 6A:
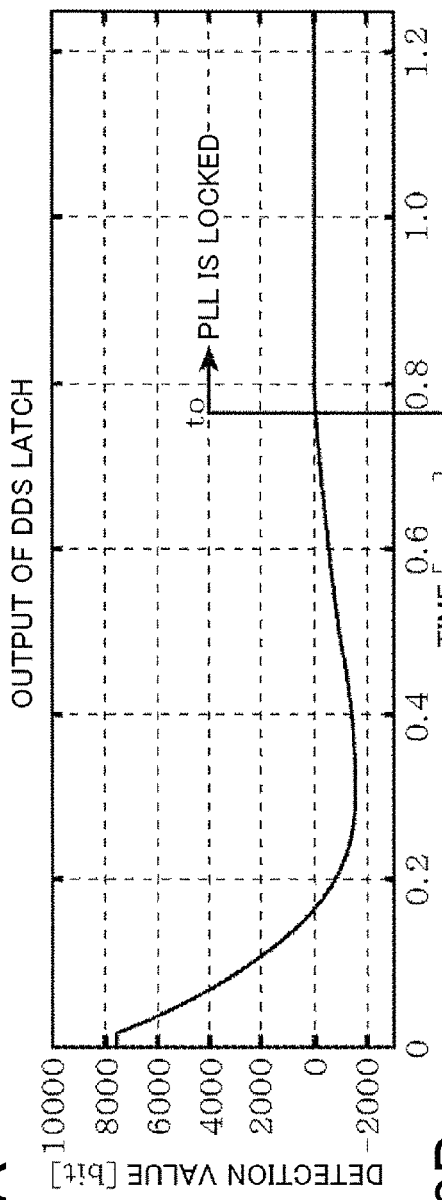
FIGS. 6A and 6B are waveform diagrams illustrating waveforms of each part in the loop for an actual device corresponding to the embodiment described above.
Figure 6B:
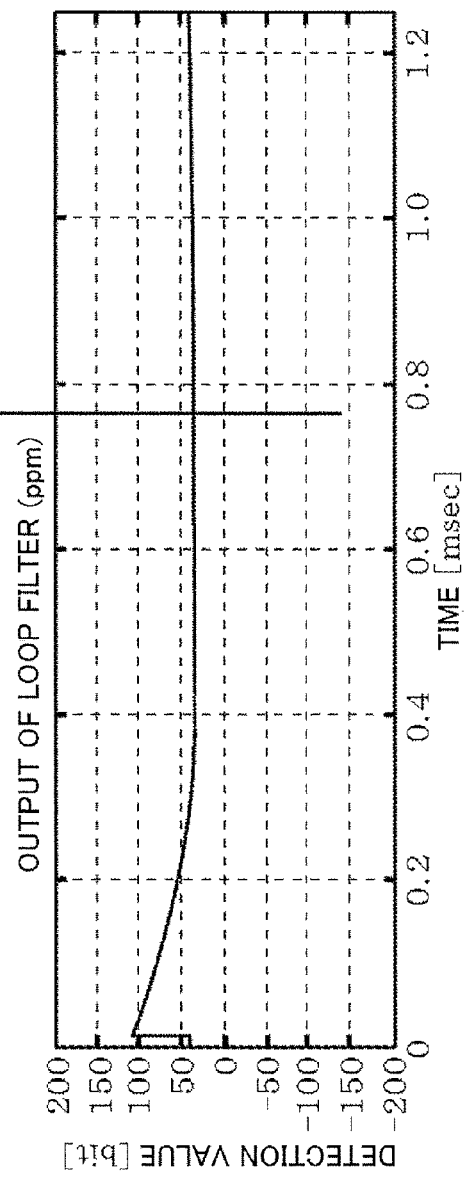

In contrast, assuming that "Δfr" is set to 6 MHz, and "(f2−f1)" is set to 5 MHz, a cycle of the latching pulse is longer than that of the sawtooth wave. Therefore, the latch point of FIG. 4A gradually rises. Accordingly, the output of the latch circuit 33 and the output of the loop filter 34 also increase. For this reason, since the subtraction value in the adder 35 increases, the frequency of the sawtooth wave gradually decreases. Finally, the PLL is locked when the frequency of the sawtooth wave becomes 5 MHz which is equal to "(f2−f1)." In this case, the DC voltage output from the loop filter 34 becomes a value corresponding to "Δfr−(f2−f1)=1 MHz." It is noted that the FIGS. 6A and 6B show actual measurement data, and in this example, the PLL is locked at timing t0.

However, as described above, in practice, the output of the frequency difference detection portion 3 is a value obtained by expressing a value "{(f2−f1)/f1}−{(f2r−f1r)/f1r}" as a 34-bit digital value. If a set of these values from the vicinity of −50° C. to the vicinity of 100° C. are expressed as "(f1−f1r)/f1r=OSC1 (ppm or ppb)" or "(f2−f2r)/f2r=OSC2 (ppm or ppb)," a change to a temperature is substantially equal to a curve of (OSC2−OSC1). Therefore, the output of the frequency difference detection portion 3 can be expressed as "(OSC2−OSC1)=temperature data."

Since the operation of latching the frequency f2 with the frequency f1 in the flip-flop circuit 31 is non-synchronous, an inconsistent period such as a metastable period may occur, and the output of the loop filter 34 may contain an instantaneous error. (When input data is latched with an edge of the clock, it is necessary to hold the input data for a certain time around the latching edge. However, when the clock and the input data change nearly simultaneously, the output may become unstable. This is called a "metastable" state) For this reason, as illustrated in FIG. 2, the cumulative averaging circuit 37 capable of averaging input values for a predetermined time is provided in the output side of the loop filter 34. As a result, even when the instantaneous error occurs, it can be removed. Since the cumulative averaging circuit 37 is provided, finally, it is possible to obtain information regarding a frequency deviation corresponding to a temperature change with high accuracy.

Figure 7:
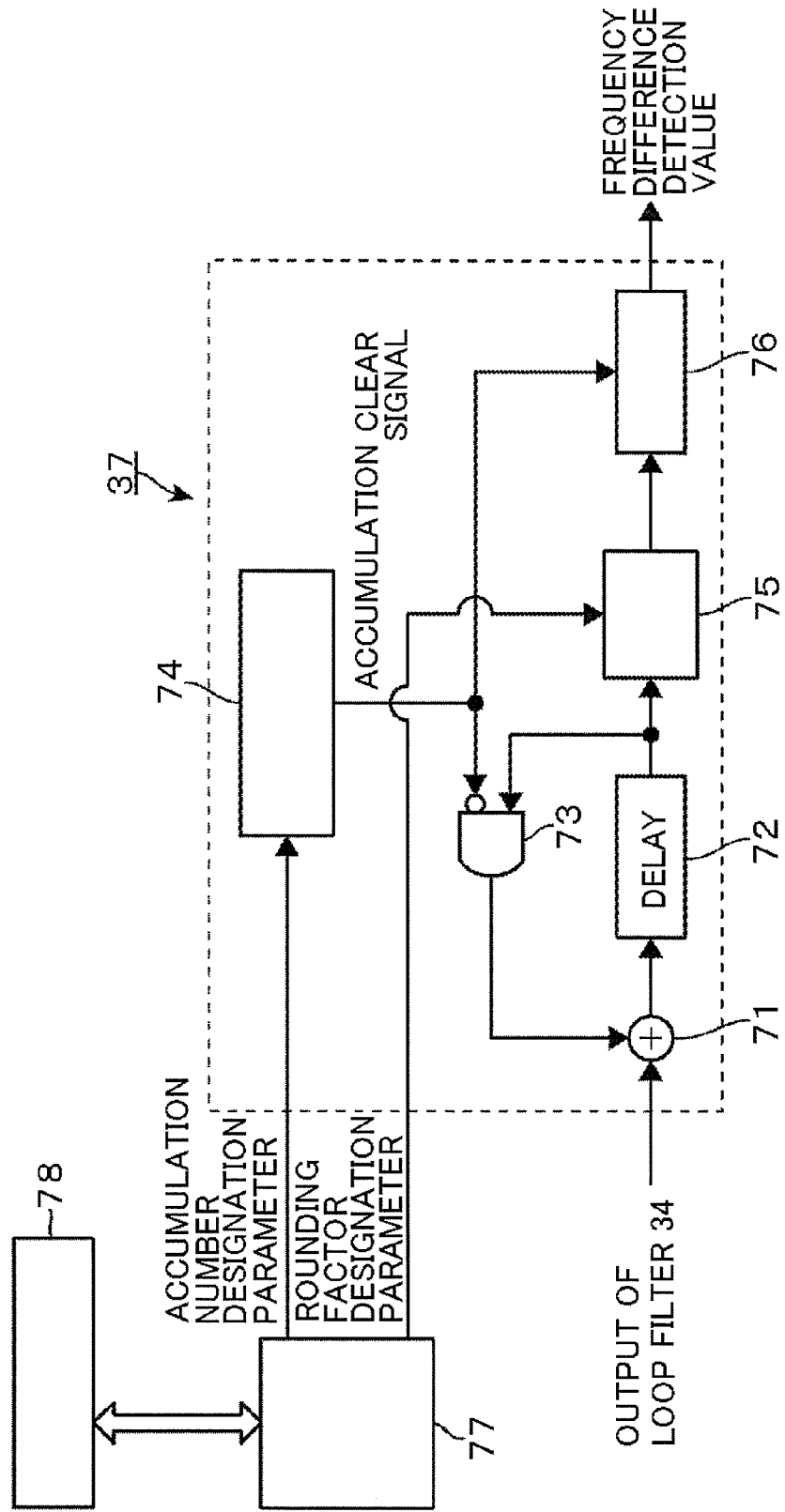
FIG. 7 is a circuit diagram specifically illustrating a circuit of a cumulative averaging processing portion of the frequency difference detection portion.

FIG. 7 is a circuit diagram illustrating the cumulative averaging circuit 37 in detail. The output (digital value) of the first loop filter 34 is input to the adder 71 as one of the input values and is added to the other input value of the adder 71. The output of the adder 71 is input to the adder 71 as the other input value via a delay circuit 72 and a gate 73 which is a logic circuit. The delay circuit 72 delays the received digital value by one clock and outputs it. That is, the addition value input to the delay circuit 72 in synchronization with a clock is output at the next clock.

Therefore, assuming that the output value of the loop filter 34 input to the adder 71 at the (k)th clock (where "k" denotes any natural number) is expressed as "Ak," the adder 71 outputs the addition value A1 to An at the (n)th clock. That is, when the first clock is input to the adder 71, the output value of the delay circuit 72 is zero, so that "A1" is output from the adder 71. When the second clock is input to the adder 71, the output value of the delay circuit 72 is "A1," so that "A1+A2" is output from the adder 71. The (k)th clock (where "k" denotes any natural number) refers to, for example, a clock corresponding to an output timing of an accumulation clear signal described below.

In this example, the delay output portion has a single delay circuit 72. However, a plurality of delay circuits 72 may be connected in series. In this case, the delay output portion outputs the received digital value by delaying it by time corresponding to a predetermined number of clocks. In this case, the predetermined number of clocks means the number of the connected delay circuits 72.

The gate 73 is to limit an accumulation number (the number of the output digital values to be added) of the output value of the loop filter 34 in the adder 71 to a setting value. The output value of the delay circuit 72 is input to one of the input terminals of the gate 73, and the accumulation clear signal from the accumulation control signal generator 74 is input to the other input terminal. In FIG. 7, the number of gates 73 is set to one corresponding to one bit. However, in practice, the gates 73 are provided as many as the number of bits of the digital value. In this example, the accumulation clear signal is a signal having a logic value "1." When the accumulation clear signal is not generated, the other input terminal of the gate 73 has a logic value "0." Therefore, the output signal from the delay circuit 72 is directly transmitted to the adder 71. When the accumulation clear signal is generated, the other input terminal of the gate 73 has a logic value "1." Therefore, the output of the gate 73 has a logic value "0," and the cumulative addition value is cleared.

In this example, the adder 71, the delay circuit 72 (delay output portion), and the gate circuit 73 constitute an accumulator.

If the setting value of the accumulation number is set to, for example, "2³" (exemplary number for convenient description), the accumulation control signal generator 74 outputs the accumulation clear signal whenever eight clocks are counted. Therefore, in this case, the output values from the loop filter 34 are sampled and added 8 times continuously. Then, this addition value is cleared. Again, similarly, the output values from the loop filter 34 are sampled and added 8 times continuously starting from the next first clock.

Meanwhile, in rear of the delay circuit 72, a rounding processing portion 75 for performing rounding (multiplication of "$2^{-m}$," where "m" denotes any natural number) is provided. The rounding processing portion 75 performs rounding for the digital value output from the delay circuit 72 depending on a predetermined rounding factor. If the rounding factor is set to, for example, "$2^{-3}$," in the aforementioned example, as a decimal expression, the rounding is performed by dividing, by "8," a value obtained by accumulating the output values from the loop filter 34 eight times at the 8th clock. A latch circuit 76 is provided in rear of the rounding processing portion 75. This latch circuit 76 outputs a digital value latched by the input of the accumulation clear signal described above. Therefore, as the accumulation clear signal is generated, the value obtained by accumulating the output value from the loop filter 34 up to that time is cleared, and the value obtained by the accumulation up to that time is output from the latch circuit 76.

As the accumulation number, for example, a value of $2^9$ to $2^{12}$ is set. As the rounding factor, for example, a value of $2^{-10}$ to $2^{-13}$ is set. For setting the accumulation number, an accumulation number designation parameter is input to the accumulation control signal generator 74 from the control portion 77 including, for example, a controller provided in a frequency synthesizer. The accumulation control signal generator 74 includes, for example, a counter. For example, as a designation value of the count of clocks for a count-up operation, corresponding to the accumulation number designation parameter, is input from the counter, the accumulation control signal generator 74 outputs the accumulation clear signal described above whenever the count of clocks reaches the designated number.

In this example, the control portion 77 and the accumulation control signal generator 74 serve as an accumulation number designation portion.

Similarly, the rounding factor is set by inputting a rounding factor designation parameter to the rounding processing portion 75 from the control portion 77. The rounding factor designation parameter corresponds to, for example, a value of the rounding factor itself. In this example, the control portion 77 is connected to an external computer 78 as an external control portion via a signal port provided in the frequency synthesizer. The connection to the external computer 78 is performed when various parameters are written to a memory of the control portion 77 in the manufacturing of the frequency synthesizer, when maintenance is performed for the frequency synthesizer, or when a user changes a part of parameters.

In this example, the control portion 77 corresponds to a rounding factor designation portion and also serves as a part of the accumulation number designation portion.

For this reason, the accumulation number and the rounding factor of the cumulative averaging processing portion 37 are also written to the memory of the control portion 77, for example, from the external computer 78 and are read from the memory and input to the accumulation control signal generator 74 and the rounding processing portion 75, respectively, when the frequency synthesizer is powered up. The accumulation number and the rounding factor are independently set by the external computer 78 (without depending on each other). In this example, the external computer 78 and the control portion 77 correspond to the accumulation number designation portion and the rounding factor designation portion, respectively. It is noted that the accumulation number and the rounding factor may also be set independently using the control portion 77 in the frequency synthesizer side without using the external computer 78.

Figure 8:
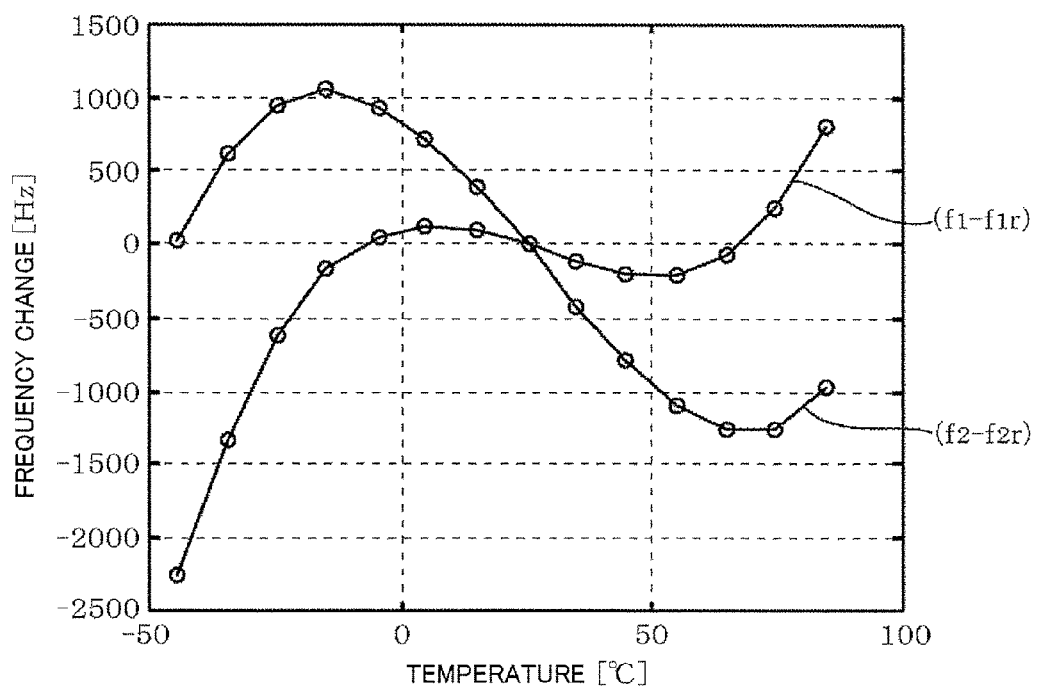
FIG. 8 is a frequency-temperature characteristic chart illustrating a relationship between a temperature and frequencies f1 and f2 of the first and second oscillation circuits.

Here, the frequency deviation information (OSC2−OSC1) corresponding to a temperature change obtained by the loop filter 34 of the PLL will be described with reference to FIGS. 8 to 11. FIG. 8 is a characteristic diagram illustrating a relationship between a temperature and a frequency by normalizing the frequencies f1 and f2 based on a reference temperature. The "normalization" described here means obtaining a relationship between a temperature and a frequency deviation based on a frequency at the reference temperature by setting the reference temperature to 25° C. and setting the frequency at the reference temperature to zero in a temperature-frequency relationship. Assuming that the frequency at a temperature of 25° C. of the first oscillation circuit 1 is denoted by "f1r," and the frequency at a temperature of 25° C. of the second oscillation circuit 2 is denoted by "f2r," that is, assuming that the frequencies f1 and f2 at a temperature of 25° C. are denoted by "f1r" and f2r," respectively, the curves of FIG. 8 show frequency changes "(f1−f1r)" and "(f2−f2r)" depending on a temperature.

Figure 9:
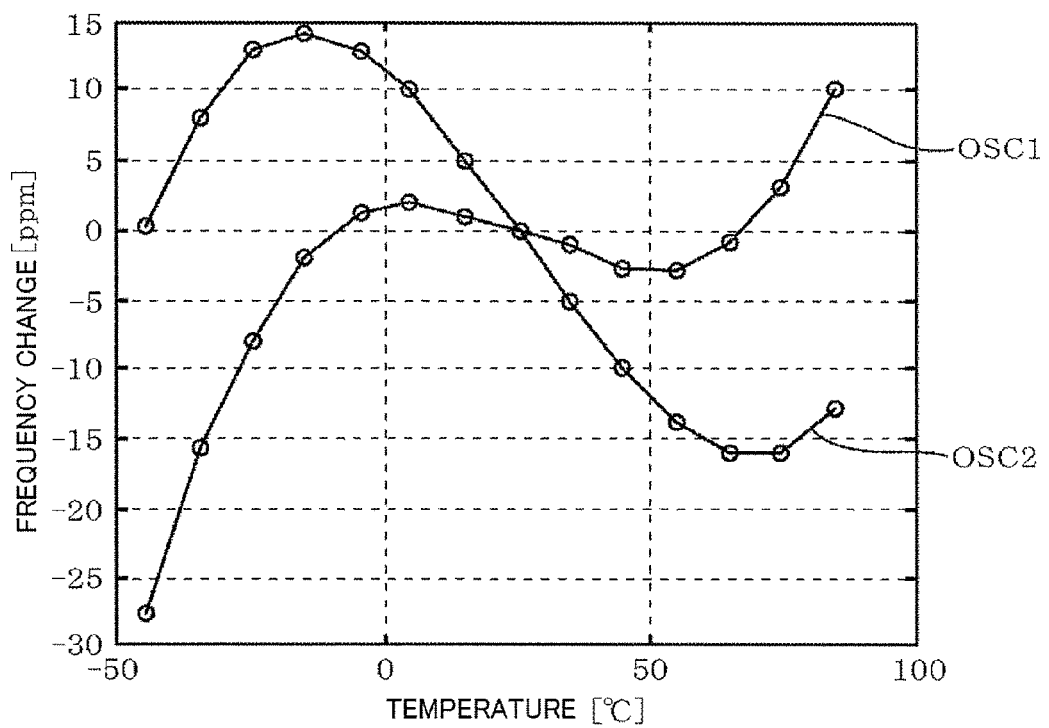
FIG. 9 is a frequency-temperature characteristic chart illustrating a relationship between a temperature and values obtained by normalizing change rates of the frequencies f1 and f2 with respect to a reference temperature.

FIG. 9 illustrates a change rate of the frequency at the reference temperature of 25° C. for the frequency at each temperature of FIG. 8. Therefore, the curves of FIG. 9 show "(f1−f1r)/f1r" and "(f2−f2r)/f2r," that is, "OSC1" and "OSC2", respectively, as described above. In addition, the value of the ordinate of FIG. 9 has a unit of [ppm].

Figure 10:
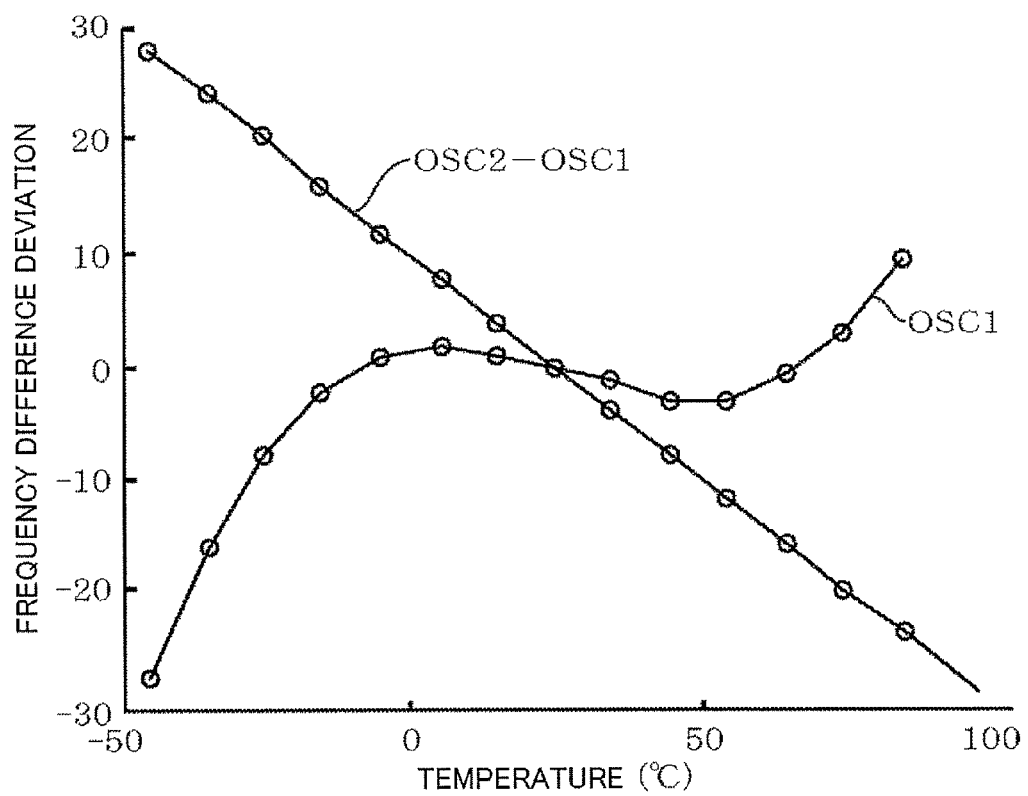
FIG. 10 is a frequency-temperature characteristic chart illustrating a relationship between a temperature and a difference between values OSC1 and OSC2 of FIG. 8.

FIG. 10 illustrates a relationship between "OSC1" and a temperature (similar to FIG. 9) and a relationship between "(OSC2−OSC1)" and a temperature. It is recognized that "(OSC2−OSC1)" has a linear relationship with a temperature. Therefore, it is recognized that "(OSC2−OSC1)" corresponds to a deviation corresponding to a temperature change from the reference temperature. In general, a frequency-temperature characteristic of a crystal unit can be expressed as a third-order function. Therefore, if a relationship between "(OSC2−OSC1)" and a frequency correction value for canceling the frequency change using this third-order function is obtained in advance, the frequency correction value can be obtained based on the detection value of "(OSC2−OSC1)."

Figure 11:
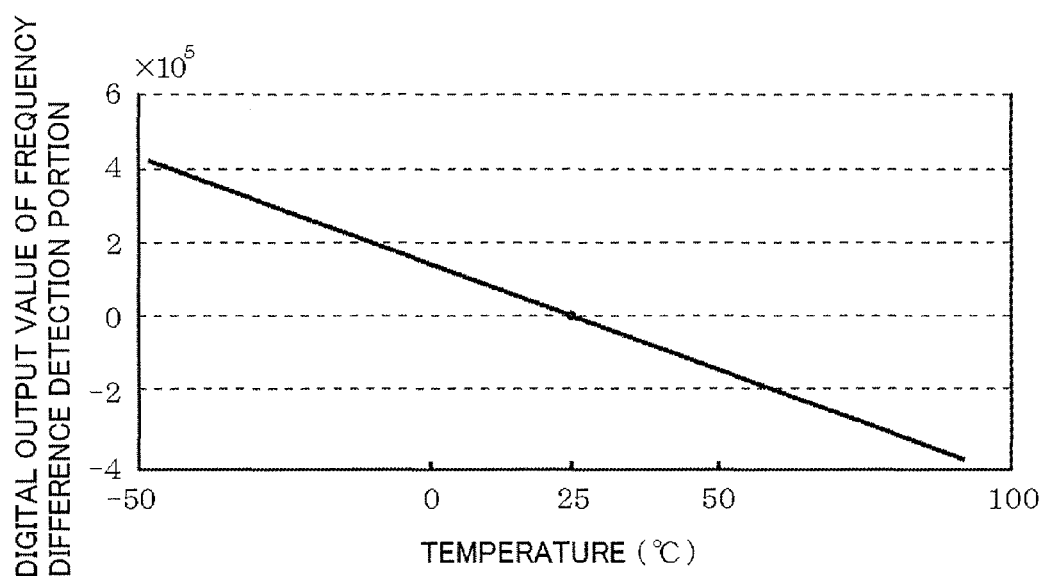
FIG. 11 is a characteristic chart illustrating a relationship between a temperature and a digital output value of the frequency difference detection portion.

FIG. 11 illustrates a relationship between a temperature and a 34-bit digital value of the output signal of the frequency difference detection portion 3. Therefore, it is recognized that "(OSC2−OSC1)" corresponds to a deviation corresponding to a temperature change from the reference temperature.

Returning to FIG. 1, the output value of the frequency difference detection portion 3 can be substantially treated as the value (OSC2−OSC1) as described above. This value can be referred to as a temperature detection value of the crystal units 10 and 20 as illustrated in FIG. 10. In this regard, a second adder (difference detection circuit) 6 is provided in rear of the frequency difference detection portion 3, and a difference between a temperature setting value as a digital signal (34-bit digital value of (OSC2−OSC1) at the setting temperature) and the value "(OSC2−OSC1)" as the output of the frequency difference detection portion 3 is detected. The temperature setting value is preferably selected as a temperature at which the value OSC1 corresponding to the first crystal unit 10 for obtaining the output of the crystal oscillator is not easily changed by a temperature change. This temperature is selected as, for example, 50° C. corresponding to the bottom portion in the curve representing a relationship between "OSC1" and a temperature of FIG. 8. It is noted that the setting temperature may be selected as 10° C. considering that the value of "OSC1" is not easily changed by a temperature change. In this case, this temperature may be lower than a room temperature occasionally. Therefore, a temperature control portion obtained by combining a heating portion and a cooling portion such as a Peltier element is provided.

In addition, a second loop filter 61 corresponding to an integration circuit portion is provided in rear of the second adder 6.

A digital-to-analog (D/A) converter 62 is provided in rear of the loop filter 61. A heater circuit 5 corresponding to the heating portion is provided in rear of the D/A converter 62. In this example, the adder 6, the loop filter 61, and the D/A converter 62 constitute a heating control portion.

Description of Elements Relating to TCXO Functionality

The oscillation device according to an embodiment disclosed here has the TCXO functionality as described above. This functionality is to perform temperature compensation for the reference clock input to the control circuit portion 200. Specifically, the frequency deviation information corresponding to the temperature change obtained from the loop filter 34 of the PLL is input to the correction value computing portion 4 corresponding to the correction value computing portion of FIG. 1, and the frequency correction value is computed therein. The frequency deviation information corresponding to the temperature change refers to a value corresponding to a difference between the oscillation frequency of the first oscillation circuit 1 when the crystal unit 10 is at the reference temperature and the oscillation frequency of the first oscillation circuit 1 when the crystal unit 10 is at the ambient temperature (temperature in the container that houses the crystal unit 10).

In this example, since the oscillation device has the OCXO functionality, the value corresponding to this difference is typically a constant value. However, when the ambient temperature of the oscillation device changes over an estimated range, the TCXO functionality is exhibited.

In the oscillation device according to an embodiment disclosed here, the frequency signal f1 obtained from the first oscillation circuit 1 is used as the reference clock of the control circuit portion 200 of FIG. 1 as described above, and this reference clock has a frequency-temperature characteristic. Therefore, the temperature compensation is performed for the frequency of the reference clock. For this purpose, first, a function representing a relationship between a temperature and the frequency signal f1, which is normalized with the reference temperature, is obtained in advance, and a function for canceling the frequency change of the frequency signal f1 is obtained based on this function. In addition, the correction value computing portion 4 computes the correction signal for canceling the frequency change based on this function and the temperature detection signal obtained from the frequency difference detection portion 3. This will be further described below.

As illustrated in FIG. 1, the first and second crystal units 10 and 20 are formed by commonly using the crystal piece Xb and are thermally combined with each other, so that the frequency difference between the oscillation circuits 1 and 2 accurately matches an ambient temperature. Therefore, the output of the frequency difference detection portion 3 is temperature difference information between the ambient temperature and the reference temperature (in this example, 25° C.). Since the frequency signal f1 output from the first oscillation circuit 1 is used as a main clock of the control portion 200, the correction value obtained from the correction value computing portion 4 is used as a signal for compensating for the operation of the control portion 200 for canceling an influence to the operation of the control portion 200 based on the frequency deviation of the frequency signal f1 caused by a deviation of the temperature from 25° C. As a result, the output frequency of the voltage-controlled oscillator 100 as the output of the oscillation device 1 according to the embodiment disclosed here is stabilized regardless of a temperature change.

Entire Operation of Embodiment

Next, the entire operation according to an embodiment disclosed here will be summarized. Focusing on the crystal oscillator of the oscillation device according to an embodiment disclosed here, the output of the crystal oscillator corresponds to the frequency signal output from the first oscillation circuit 1. In addition, the heating is performed by the heater circuit 5 until an atmosphere round the crystal units 10 and 20 has a desired temperature. The first crystal unit 10 and the first oscillation circuit 1 are used to generate a frequency signal as the output of the crystal oscillator. In addition, the first crystal unit 10 and the first oscillation circuit 1 also serve as a temperature detection portion along with the second crystal unit 20 and the second oscillation circuit 2. The value (OSC2−OSC1) as a frequency difference between the frequency signals obtained from the oscillation circuits 1 and 2 corresponds to a temperature as described above. The adder 6 extracts a difference from the temperature setting value (for example, the value (OSC2−OSC1) at a temperature of 50° C.).

The value (OSC2−OSC1) as the frequency difference is obtained from the frequency detection portion 3 based on the operation described above using the circuit of FIG. 2. In addition, the digital value obtained from the loop filter 34 is accumulated in the cumulative averaging processing portion 31 of FIG. 7 by a predetermined sampling count, and the rounding is performed based on a predetermined rounding factor (multiplication of $2^{-m}$).

Figure 12:
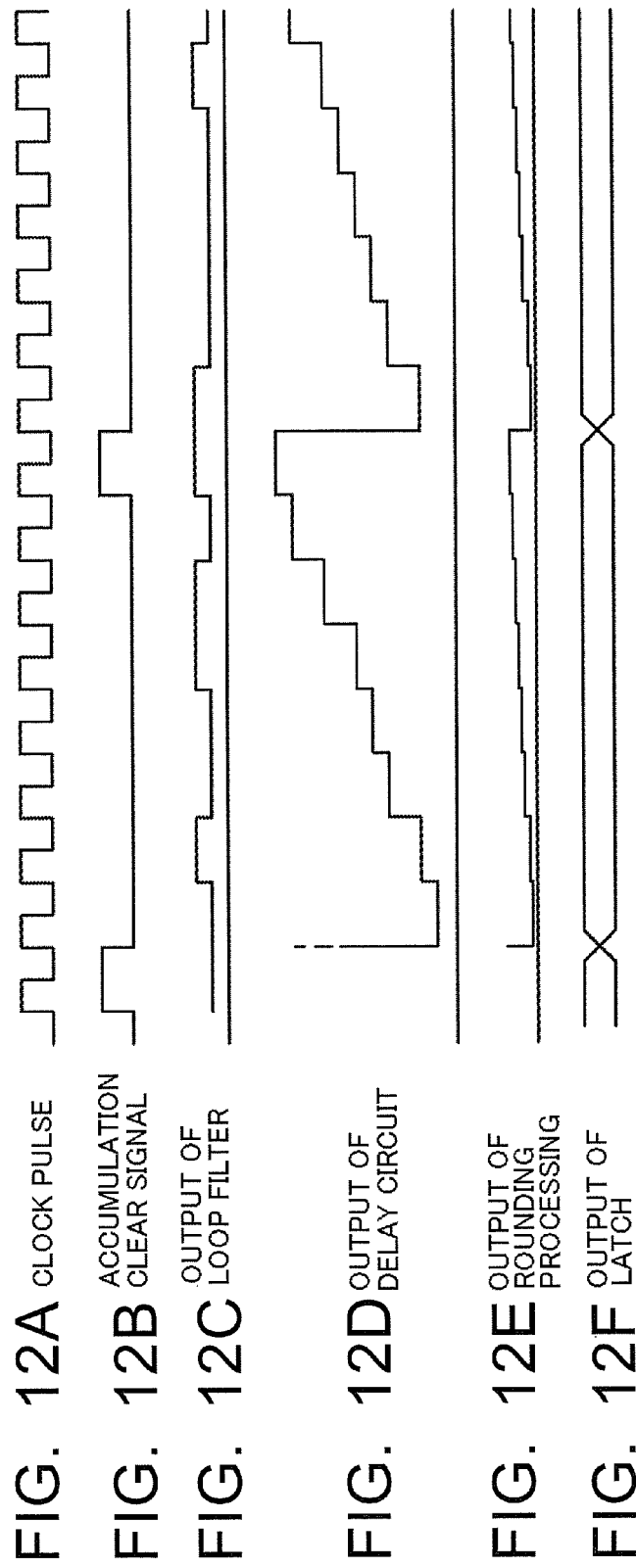
FIGS. 12A to 12F are timing charts illustrating waveforms of each part of the cumulative averaging processing portion.

FIGS. 12A to 12F are timing charts illustrating signals from each part in the cumulative averaging processing portion 37 of FIG. 7. FIG. 12A illustrates the clock pulse. FIG. 12B illustrates the accumulation clear signal. FIG. 12C illustrates the output from the loop filter 34. FIG. 12D illustrates the output value from the delay circuit 72. FIG. 12E illustrates the output of the rounding processing portion 75. FIG. 12F illustrates the output of the latch circuit 76. In this example, both the accumulation number and the rounding factor are set to "8" for convenient description purposes. The output value of the rounding processing portion 75 obtained when the accumulation clear signal is set to a logic value "1" is output from the cumulative averaging processing portion 31 to the adder 6 and the correction value computing portion 4 of FIG. 1 via the latch circuit 76.

As described above, the cumulative averaging processing portion 37 eliminates an instantaneous error contained in the output of the loop filter 34. However, by independently controlling the accumulation number and the rounding factor, it is possible to control a matching relationship between a temperature and the value (OSC2−OSC1) described above.

Figure 13:
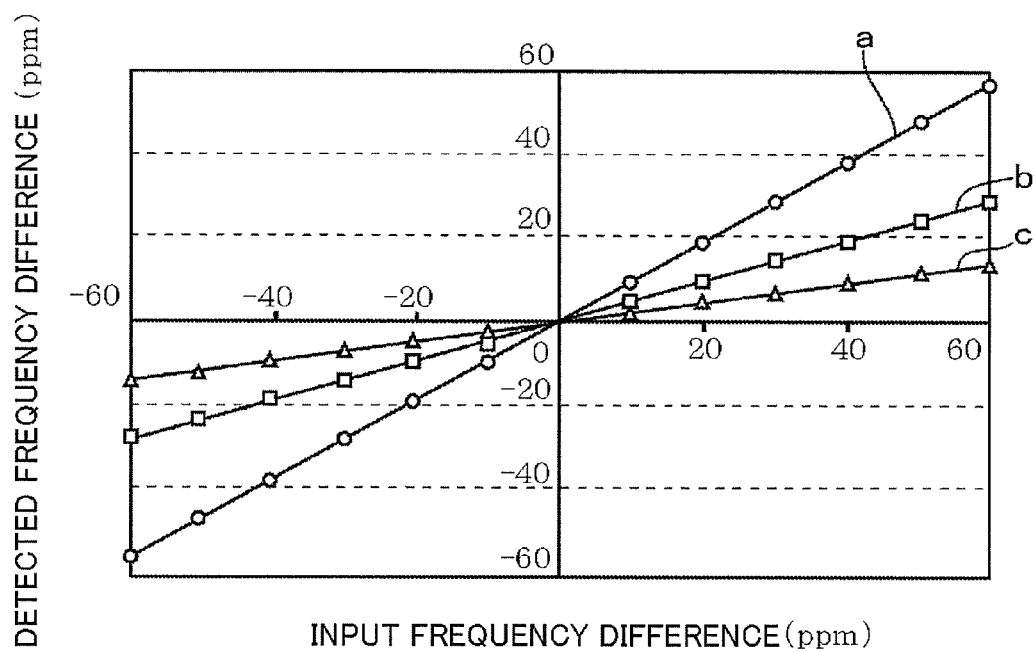
FIG. 13 is a characteristic chart illustrating input/output data of the cumulative averaging processing portion by using a setting value of the rounding factor of the cumulative averaging processing portion as a parameter.

FIG. 13 illustrates a matching relationship between the input and output values of the cumulative averaging processing portion 37 by using the rounding factor as a parameter. In FIG. 13, the curve "a" is obtained by setting the rounding factor to "$2^{-10}$," the curve "b" is obtained by setting the rounding factor to "$2^{-11}$" (by setting a divisor to "$2^{11}$") and the curve "c" is obtained by setting the rounding factor to "$2^{-12}$" (by setting a divisor to "$2^{12}$"). In overall curves, the accumulation number is set to "$2^{10}$." From FIG. 13, it is recognized that the matching relationship between a temperature and the value (OSC2−OSC1) described above can be controlled. Therefore, in the curves "b" and "c," the divisor for dividing the accumulated temperature detection value in the rounding processing portion 75 is greater than the accumulation number described above.

Effects of Embodiment

As described above, according to the embodiment described above, in the crystal oscillator (OCXO) for constantly maintaining an ambient temperature of the crystal unit, the value corresponding to a difference between the oscillation frequencies of the crystal units 10 and 20 is treated as a temperature detection value. In addition, when the heating portion is controlled based on the value obtained by accumulating and averaging (rounding) the temperature detection value, the rounding factor and the accumulation number of the temperature detection value can be selected independently. For this reason, it is possible to reduce a variation of the temperature detection sensitivity by selecting the rounding factor even when a ratio (temperature detection sensitivity) of the oscillation frequency change to the temperature change is different between crystal pieces due to a difference of the cut orientation of the crystal piece or a variation between batches of the crystal pieces. As a result, it is possible to appropriately set a size of the circuit for performing the temperature control. In addition, it is possible to appropriately perform the heater control and prevent an erroneous operation in the heater control. From another viewpoint, this means that freedom of selection of the employable crystal pieces is improved.

OTHERS

Although the crystal piece Xb is commonly used between the first and second crystal units 10 and 20 in the example described above, the crystal piece Xb may not be commonalized. In this case, for example, the first and second crystal units 10 and 20 may be disposed in a common casing. In this configuration, since the first and second crystal units 10 and 20 are disposed in substantially the same temperature atmosphere, the same effect can be obtained.

The output signal of the DDS circuit portion 36 of the frequency difference detection portion 3 may be any frequency signal whose signal value repeats rising and falling along time without limiting to a sawtooth wave. For example, the output signal of the DDS circuit portion 36 may be a sinusoidal wave. In addition, the frequency difference detection portion 3 may be configured such that the frequencies f1 and f2 are counted using a counter, the value corresponding to "Δfr" is subtracted from a difference value of the count value, and a value corresponding to the obtained count value is output.

In the embodiment described above, the first crystal unit 10 and the first oscillation circuit 1 have functionalities of obtaining the temperature detection value and creating the output of the crystal oscillator. That is, the oscillation circuit 1 commonly uses the oscillation circuit for detecting a temperature and the oscillation circuit for the output of the crystal oscillator. However, the embodiment disclosed here may be modified such that, for example, three crystal units are prepared, and three oscillation circuits are prepared. For example, in the configuration of FIG. 1, a third crystal unit and a third oscillation circuit connected to the third crystal unit may be prepared, so that the temperature detection value may be obtained by using the output of the third oscillation circuit as the output of the crystal oscillator and inputting the oscillation outputs of the first and second oscillation circuits to the frequency difference detection portion. In this case, if the OCXO and the TCXO are combined, the output of the third crystal oscillation circuit is used as a clock of the DDS 201.

The frequency synthesizer as the oscillation device illustrated in FIGS. 1 and 15 has the crystal oscillator according to an embodiment disclosed here, including the crystal units 10 and 20, the oscillation circuits 1 and 2, the frequency difference detection portion 3, the adder 6, and the heater circuit 5. However, the embodiment disclosed here may be modified in various manners without limiting to a configuration of the frequency synthesizer. For example, the oscillation output of the first oscillation circuit 1 may be used as the output of the crystal oscillator of the embodiment disclosed here. That is, the control circuit portion 200 may not be used.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal oscillator, comprising:
   an oscillation circuit, being connected to a crystal unit for generating an oscillator output;
   first and second oscillation circuits, being connected to first and second temperature detection crystal units, respectively;
   a heating portion for constantly maintaining an ambient temperature of each of the crystal units;
   a frequency difference detection portion that obtains, as a temperature detection value, a digital value corresponding to a difference value between a value corresponding to a difference between frequencies f1 and f1r and a value corresponding to a difference between frequencies f2 and f2r, where "f1" denotes an oscillation frequency of the first oscillation circuit, "f1r" denotes an oscillation frequency of the first oscillation circuit at a reference temperature, "f2" denotes an oscillation frequency of the second oscillation circuit, and "f2r" denotes an oscillation frequency of the second oscillation circuit at the reference temperature;
   an accumulator that accumulates the temperature detection value as the digital value obtained from the frequency difference detection portion depending on a designated accumulation number;
   a rounding processing portion that performs rounding for the temperature detection value accumulated in the accumulator depending on a rounding factor designated independently from designation of the accumulation number; and
   a heating control portion that controls power supplied to a heating portion based on the temperature detection value subjected to the rounding in the rounding processing portion.

2. The crystal oscillator according to claim 1, further comprising:
   an accumulation number designation portion, being configured to designate the accumulation number in the accumulator; and
   a rounding factor designation portion, being configured to designate the rounding factor in the rounding processing portion.

3. The crystal oscillator according to claim 2, wherein the accumulator includes:

an adder that receives the temperature detection value, a delay output portion that outputs an output value from the adder by delaying a predetermined number of clocks m, where "m" denotes any natural number, and a gate circuit that inputs the output value of the delay output portion to the adder as an addend added to the temperature detection value and outputs zero based on a clear signal input from the accumulation number designation portion whenever a count of clocks reaches a number of clocks m' greater than the number of clocks m.

4. The crystal oscillator according to claim 3, wherein the delay output portion outputs the output value from the adder by delaying one clock.

5. The crystal oscillator according to claim 1, wherein the accumulation number of the temperature detection value in the accumulator is set to $2^9$ to $2^{12}$.

6. The crystal oscillator according to claim 1, wherein the rounding factor of the rounding processing performed by the rounding processing portion for the accumulated temperature detection value is set to $2^{10}$ to $2^{13}$.

7. The crystal oscillator according to claim 1, wherein a divisor used by the rounding processing portion in division for the accumulated temperature detection value is greater than the accumulation number.

8. An oscillation device, comprising:

the crystal oscillator according to claim 1; and a main body circuit portion of the oscillation device including a phase-locked loop (PLL), in which an oscillation output of the crystal oscillator is used as a clock signal.

\* \* \* \* \*